United States Patent [19]
Moll

[11] Patent Number: 5,436,469
[45] Date of Patent: Jul. 25, 1995

[54] BAND MINIMA TRANSISTOR

[76] Inventor: Nicolas J. Moll, Star Rte. 2 Box 408, La Honda, Calif. 94020

[21] Appl. No.: 259,801

[22] Filed: Jun. 15, 1994

[51] Int. Cl.$^6$ .................... H01L 29/205; H01L 29/76
[52] U.S. Cl. ........................................ 257/23; 257/22; 257/25; 257/26; 257/18; 257/198
[58] Field of Search ................ 257/22, 18, 23, 25, 257/26, 198

[56] References Cited

U.S. PATENT DOCUMENTS

| | | | |
|---|---|---|---|
| 4,758,870 | 7/1988 | Hase et al. | 257/26 |
| 4,829,343 | 5/1989 | Levi | 357/4 |
| 5,124,771 | 6/1992 | Taira et al. | 257/23 |
| 5,250,815 | 10/1993 | Battersby et al. | 257/6 |
| 5,258,624 | 11/1993 | Battersby et al. | 257/11 |
| 5,296,721 | 3/1994 | Schulman et al. | 257/25 |

FOREIGN PATENT DOCUMENTS 1132160 5/1989 Japan .................................. 257/23

OTHER PUBLICATIONS

Collins et al *Appl Phys Lett.*, vol. 58 No. 15 15 Apr. 1991 "Experimental . . . Transistor".
A. F. J. Levi & T. H. Chiu, "Room–Temperature Operation of Hot–Electron Transistors", Applied Physics Letters vol. 51, No. 13, Sep. 28, 1987, pp. 984–986.
M. Guzzu and J. L. Staehli, "Band Structure of the GaAs/AlAs Solid Solutions", Solid State Phenomena, vol. 10, 1989, pp. 25–52.
S. M. Sze, Article 2.7.5 Fast Recovery Diode, Physics of Semiconductor Devices, 2nd edition, Wiley & Sons, p. 116.
S. M. Sze, Article 2.6 Transient Behavior and Noise, Physics of Semiconductor Devices, 2nd edition, Wiley & Sons, pp. 108–111.
S. M. Sze, Article 11.2.2 Physics of Semiconductor Devices, 2nd edition, Wiley & Sons, pp. 645–651.
R. A. Smith, Wave Mechanics of Crystalline Solids, Chapman & Hall, 1968.
M. E. Kim, A. Das, and S. D. Senturia, "Electron scattering interaction with coupled plasmon–polar–phonon modes in degenerate semiconductors", Physical Review B, vol. 18, No. 12, Dec. 15, 1978, pp. 6890–6899.
A. F. J. Levi, J. R. Hayes, P. M. Platzman and W. Wiegmann, "Hot electron Spectroscopy of GaAs", Physica 134B (1985), Elsevier Science Publishers B. V., pp. 480–486.
M. Heiblum, M. I. Nathan, D. C. Thomas, and C. M. Knoedler, "Direct Observation of Ballistic Transport in GaAs", Physical Review Letters, vol. 55, No. 20, Nov. 11, 1985, pp. 2200–2203.
T. S. Moise, A. C. Seabaugh, E. A. Beam III, Y. C. Kao, and J. N. Randall, "Room–Temperature Operation of InGaAs–based Hot–Electron Transistors", 51st Device Research Conference, paper VB-2 (1993).
Robert H. Kingston, "Switching Time in Junction Diodes and Junction Transistors", Proc. IRE, vol. 42, (1954), pp. 829–834.

*Primary Examiner*—Jerome Jackson

[57] ABSTRACT

A room temperature high speed transistor that does not suffer deleterious effects from plasmon scattering. The transistor of the present invention comprises a semiconducting base region having a type of majority carriers and sub-band ordering associated with the majority carriers. The transistor further comprises a semiconducting collector region contacting the base region at a collector-base heterojunction, the semiconducting collector region having the same type of majority carriers as the semiconducting base region and having a sub-band ordering different than that of the base region. The transistor further comprises a semiconducting emitter region contacting the base region at an emitter-base heterojunction, the semiconducting emitter region having the same type of majority carriers as the semiconducting base region. In active operation of the transistor of the present invention, carriers are injected from a main sub-band in the emitter region into a satellite sub-band the base region. The carriers are then transported from the satellite sub-band in the base region to a main sub-band in the collector region. Intravalley scattering processes, including plasmon scattering, are not deleterious in the present invention because the carriers injected into satellite sub-band of the base region are successful collected in the main sub-band of the collector region independent of any energy lost through the intravalley scattering.

20 Claims, 4 Drawing Sheets

BAND MINIMA TRANSISTOR

FIELD OF THE INVENTION

The present invention generally relates to semiconductor devices and more particularly to high speed transistors.

BACKGROUND OF THE INVENTION

Various types of high speed transistors are known in the prior art. A particular type of high speed transistor is known as a hot electron transistor. While early work on these devices focussed on low-temperature operation, because of small gain and small collector base barriers, advances in material technology have lead to operation of hot electron transistors at room temperature. An example of such a hot electron transistor using materials lattice matched to GaSb are described in "Room-temperature operation of hot-electron transistors" by Levi et al., Appl. Phys. Lett., Vol. 51, pp. 984–986, and U.S. Pat. No. 4,829,343 entitled "Hot Electron Transistor" issued to Levi et al. May 9, 1989. Because these documents provide helpful background material, they are incorporated herein by reference. These devices rely upon a significant offset between an emitter injection energy and a collector energy barrier to allow for energy loss by hot electrons as they traverse the base and to reduce quantum mechanical reflection at the collector.

In previously known hot electron transistors, the hot electrons lose their energy by a variety of intravalley scattering processes including optical and acoustic phonon scattering, and various forms of plasmon scattering. Plasmon scattering is generally thought to be the most serious problem. Plasmons, which are the quantum particle manifestation of density waves in a concentration of majority carriers, feature a broad manifold of energy versus crystal momentum, expressed as k. Because of the broad plasmon energy manifold, hot electrons easily fulfill momentum, or k-vector, matching requirements and therefore lose energy rapidly in the form of plasmons. Once the hot electrons have lost more energy than a difference between their injection energy and the collector barrier, they contribute to an undesired base current rather than a desired collector current.

What is needed is a room temperature high speed transistor that does not suffer deleterious effects from plasmon scattering.

SUMMARY OF THE INVENTION

The present invention provides a room temperature high speed transistor that does not suffer deleterious effects from plasmon scattering. In active operation of the transistor of the present invention, carriers are injected from a main sub-band in a semiconducting emitter region of the transistor into a satellite sub-band in a semiconducting base region of the transistor. The carriers are then transported from the satellite sub-band in the base region to a main sub-band in a semiconducting collector region. Intravalley scattering processes, including plasmon scattering, are not deleterious in the present invention because the carriers injected into the satellite sub-band of the base region are successfully collected in the main sub-band of the collector region independent of any energy lost through the intravalley scattering.

Briefly and in general terms the transistor of the present invention comprises a semiconducting base region having a type of majority carriers and sub-band ordering associated with the majority carriers. The transistor further comprises a semiconducting collector region contacting the base region at a collector-base heterojunction, the semiconducting collector region having the same type of: majority carriers as the semiconducting base region and having a sub-band ordering different than that of the base region. The transistor further comprises a semiconducting emitter region contacting the base region at an emitter-base heterojunction, the semiconducting emitter region having the same type of majority carriers as the semiconducting base region. Preferably the majority carriers are electrons. Accordingly, in the preferred embodiment the base region has a conduction sub-band ordering associated with the electrons and the collector region has a conduction sub-band ordering that is different than that of the base region. Additionally, the emitter region has a conduction sub-band ordering that is different than that of the base region.

Preferably, the base region includes a direct material, such as an InGaAs alloy, which has a number of conduction sub-bands arranged in a sub-band ordering. For example, the InGaAs alloy has a Brillouin zone including a conduction band main minimum at a bottom of the conduction band that is located at a Gamma point in k-space (the terminology used to describe the band structure is conventional and well known to those skilled in the art), a next lowest conduction band satellite minimum that is located at an L point in k-space, and a next lowest conduction band satellite minimum that is located at an X point in k-space. Accordingly, the conduction sub-band ordering of the InGaAs alloy is Gamma-L-X.

Preferably, the collector and emitter regions each include a respective indirect material, such as an AlAs/GaAs superlattice, which has a number of conduction sub-bands arranged in a sub-band ordering different than that of the base region. For example, the AlAs/GaAs superlattice has a Brillouin zone including a conduction band main minimum at a bottom of the conduction band that is located at an X point in k-space, a next lowest conduction band satellite minimum that is located at a Gamma point in k-space, and a next lowest conduction band satellite minimum that is located at an L point in k-space. Accordingly, the conduction sub-band ordering of the superlattice is X-Gamma-L, which is substantially different than the Gamma-L-X conduction sub-band ordering of the base region.

Of course, the present invention is not strictly limited to materials having a Gamma-L-X conduction sub-band ordering for the base region, and having an X-Gamma-L conduction band ordering for the collector and emitter regions. A guiding principle of the invention is that the base region has sub-band ordering and the collector region has a sub-band ordering that is different than that of the base region. Accordingly, other embodiments of the invention have a sub-band ordering other than that in the preferred embodiment.

Furthermore, it should be understood that the present invention is not strictly limited to materials having electrons as majority carriers. Since another guiding principle of the invention is that the base, emitter, and collector regions have the same majority carriers, it should be understood that in some alternative embodiments, holes are the majority carriers. Accordingly the base region has a valence sub-band ordering associated with the holes and the collector region has a valence sub-band ordering that is different than that of the base region.

Other aspects and advantages of the present invention will become apparent from the following detailed description, taken in conjunction with the accompanying drawings, illustrating by way of example the principles of the invention.

DETAILED DESCRIPTION OF PREFERRED EMBODIMENT

Figure 1:
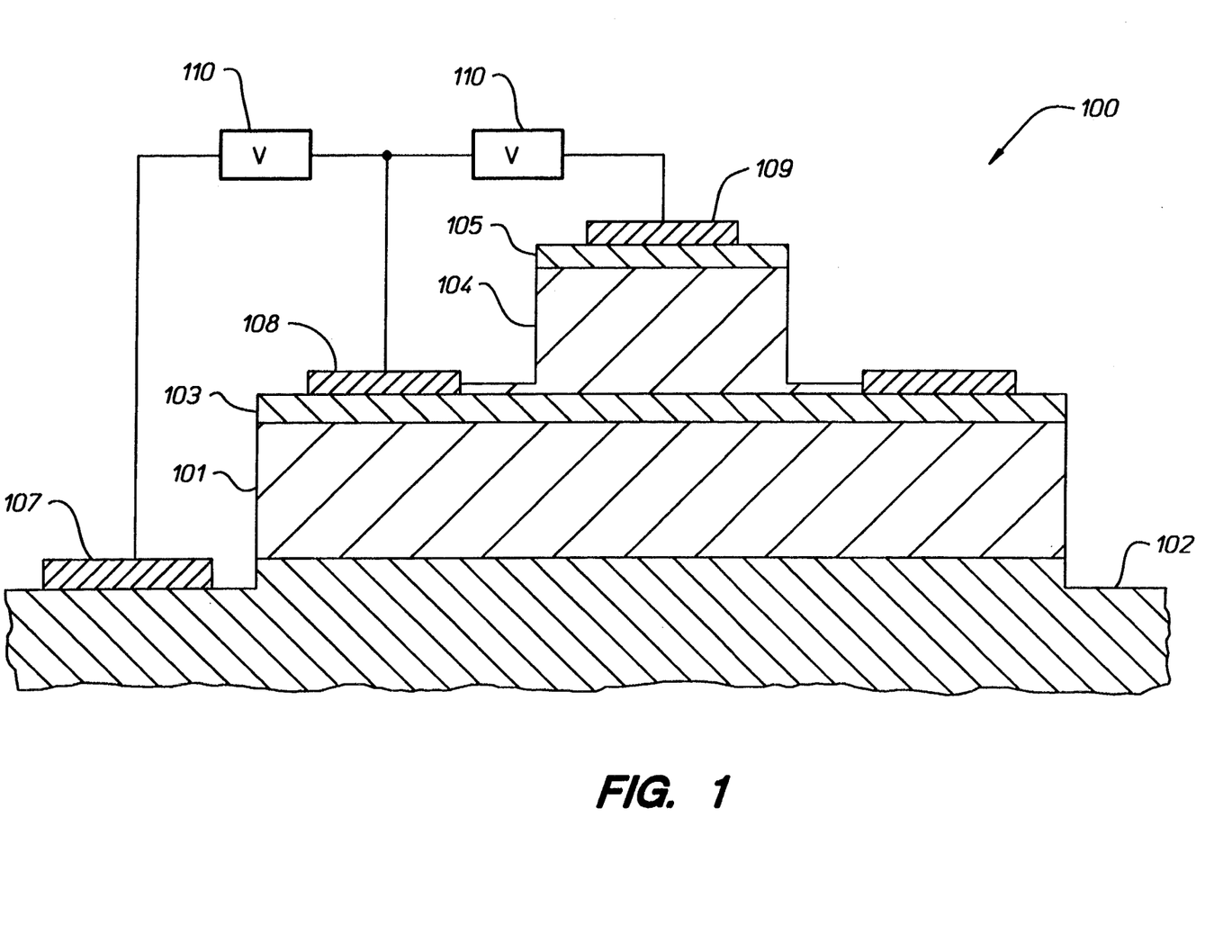
FIG. 1 schematically depicts a transistor according to a preferred embodiment of the invention.

FIG. 1 schematically depicts a transistor of the invention as preferably embodied in a heteroepitaxial structure 100. As shown the transistor of the present invention comprises a semiconducting collector region 101, preferably an indirect material comprising an AlAs/GaAs superlattice approximately 420 to 1250 angstroms thick. Growth is done by molecular beam epitaxy lattice-matched to a (100)-oriented GaAs substrate 102, which is doped with five times ten to the eighteenth Silicon atoms per cubic centimeter of the GaAs.

The transistor further comprises a semiconducting base region 103, preferably a direct material comprising an InGaAs alloy approximately 100–160 Angstroms thick, which contacts the collector region at a collector base heterojunction. Growth is done by molecular beam epitaxy onto a GaAs layer of the superlattice. A semiconducting emitter region 104, preferably the indirect material comprising the AlAs/GaAs superlattice approximately 420 to 1250 angstroms thick. Growth is done by molecular beam epitaxy onto the base region. A layer of InGaAs alloy 105 with an Indium mole fraction on the order of 0.5, and doped with 2 times ten to the nineteenth Silicon atoms per cubic centimeter of the InGaAs is deposited onto the emitter region to provide good electrical communication therewith.

Electrical contacts 107, 108, 109 preferably MoAu alloy, and suitable voltage sources 110 are coupled to collector, emitter, and base regions for applying voltage to control a flow of the majority carriers across the collector base heterojunction and emitter base heterojunction. Preferably, after patterning the heterostructure (substantially in the manner shown in FIG. 1) by standard lithography and etching techniques, the MoAu alloy is evaporated onto the base, emitter, and collector regions to form ohmic contacts.

The collector base heterojunction is graded, preferably by varying doping and layer thickness in the GaAs of the AlAs/GaAs superlattice while the superlattice of the collector region is being grown by molecular beam epitaxy. A preferred method for growing the superlattice of the collector region is to begin by depositing an initial ten pairs of alternating layers of AlAs and GaAs onto the GaAs substrate 102. Each of the ten initial layers of AlAs has a thickness of 9 mL. Each of the ten initial GaAs superlattice layers has a thickness of 6 mL and is doped with one times ten to the eighteenth Silicon atoms per cubic centimeter of the GaAs. One mL is defined as a single layer of Al and As or Ga and As atoms, which is approximately 0.2827 nanometers thick. The superlattice is then completed by depositing a subsequent four pairs of alternating layers of AlAs and un-doped GaAs at a region where the superlattice is to contact the InGaAs. In a first member of the four pairs, the AlAs layer has a thickness of 9 mL, and the GaAs layer has a thickness of 6 mL. In a second member of the four pairs, the AlAs layer has a thickness of 8 mL, and the GaAs layer has a thickness of 6 mL. In a third member of the four pairs, the AlAs layer has a thickness of 6 mL, and the GaAs layer has a thickness of 6 mL. In a fourth member of the four pairs, the AlAs layer has a thickness of 4 mL, and the GaAs layer has a thickness of 4 mL. Accordingly, the superlattice layers are thinnest near the collector base heterojunction.

The superlattice of the emitter region is grown in a similar manner as discussed previously herein with respect to the growth of the superlattice of the collector region. Just as the layers of the superlattice of the collector region are thinnest near the collector base heterojunction, so are the layers of the superlattice of the emitter region thinnest near the emitter base heterojunction.

The superlattice of the emitter region is doped by putting Si in the GaAs layers of the superlattice. This is the best way currently known of achieving, at least in the AlAs/GaAs material system, high electron concentration. Doping is varied just as with the superlattice of the collector region, so that GaAs layers of the superlattice of the emitter region are un-doped at a region where the superlattice is to contact the InGaAs.

Accordingly, the emitter base heterojunction is graded in a similar manner as the collector base heterojunction. The emitter base heterojunction is graded by varying doping and layer thickness in the GaAs of the AlAs/GaAs superlattice of the collector region while the superlattice of the collector region is being grown by molecular beam epitaxy. The emitter base heterojunction is sufficiently graded so that under suitable bias an injection energy level of the carriers causes the carriers to pass from a sub-band at a point in k-space in the emitter region to the sub-band at the corresponding point in k-space in the base region. For example in the preferred embodiment including the AlAs/GaAs superlattice and InGaAs shown in FIG. 1, the emitter base heterojunction therebetween is sufficiently graded so that under the bias an injection energy level of the electrons causes the electrons to pass from the conduction band main minimum at the X point in the superlattice to the conduction band satellite minimum at the X point in the InGaAs.

In accordance with the principles of the invention, the base region is sufficiently doped so that under suitable bias the energy barrier is lowered to provide the flow of carriers across the emitter base heterojunction. For example, in the base region the InGaAs is sufficiently doped with Silicon so that under the forward bias the energy barrier is lowered to provide the flow of carriers across the emitter base heterojunction. The preferred material 103 is pseudomorphic InGaAs with an InAs mole fraction on the order of 0.25, and doped with 2 times ten to the nineteenth Silicon atoms per cubic centimeter of the InGaAs. This is partly due to a desirable built in strain in the base region. Higher electron concentrations are achieved in InGaAs than in GaAs, which is desirable for low resistance.

Figure 2:
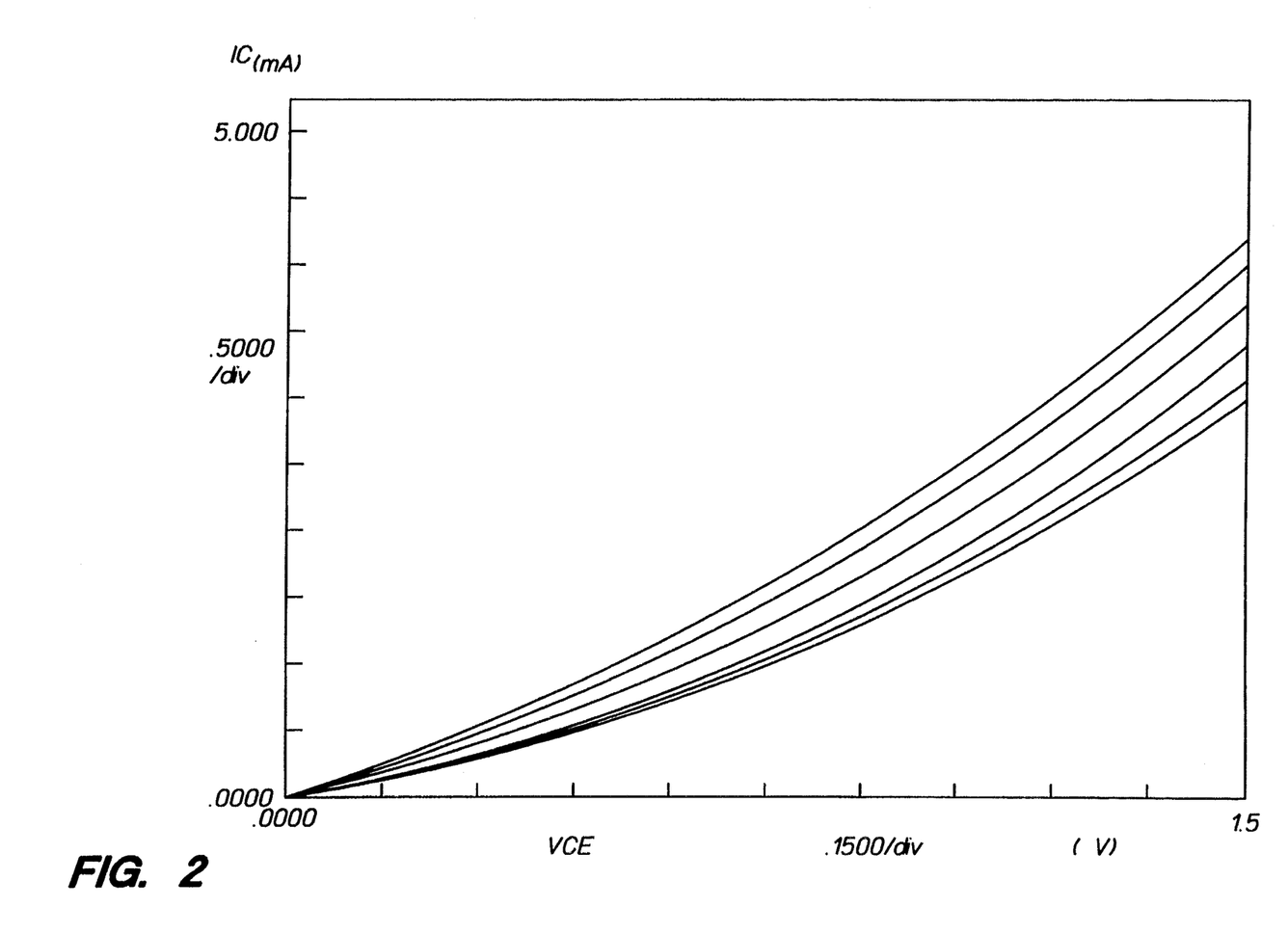
FIG. 2 shows a current-voltage characteristic that was measured using the transistor depicted in FIG. 1.

FIG. 2 shows a current-voltage characteristic diagram that was measured at different base current levels using the transistor depicted in FIG. 1, suitably biased by the voltage sources. It should be noted that FIG. 2 shows cut off and saturation regions of the diagram in addition to exhibiting gain characteristics in an active region of the diagram. For example, good gain is exhibited at a base current near 10 micro-amps. The base current step shown for the family of curves shown in FIG. 2 is 5 micro-amps.

Figure 3:
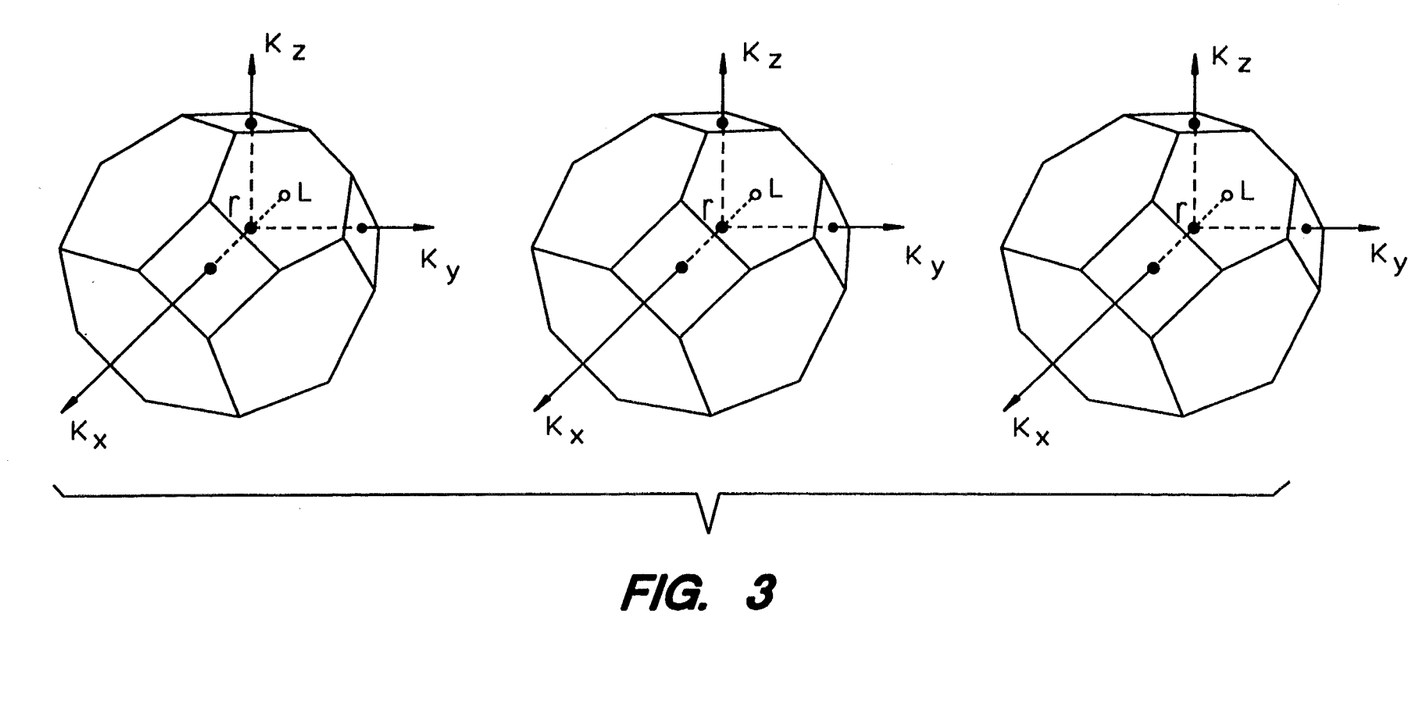
FIG. 3 is a diagram representatively illustrating the Brillouin Zones of emitter, base, and collector regions of the transistor.

FIG. 3 is a diagram representatively illustrating the Brillouin Zones of the emitter, base, and collector regions. In accordance with the preferred embodiment of the invention using the two materials of the AlAs/GaAs superlattice and the InGaAs alloy, the left hand side of FIG. 3 shows an AlAs/GaAs superlattice Brillouin zone 301 of the emitter region of the transistor, the center of FIG. 3 shows an InGaAs Brillouin zone 302, and the right hand side of FIG. 3 shows an AlAs/GaAs superlattice Brillouin zone 303 of the collector region. As shown in FIG. 3, the each of the emitter, base, and collector regions has a respective Brillouin zone that includes a respective X point in k-space. Gamma and L points are also shown.

Figure 4:
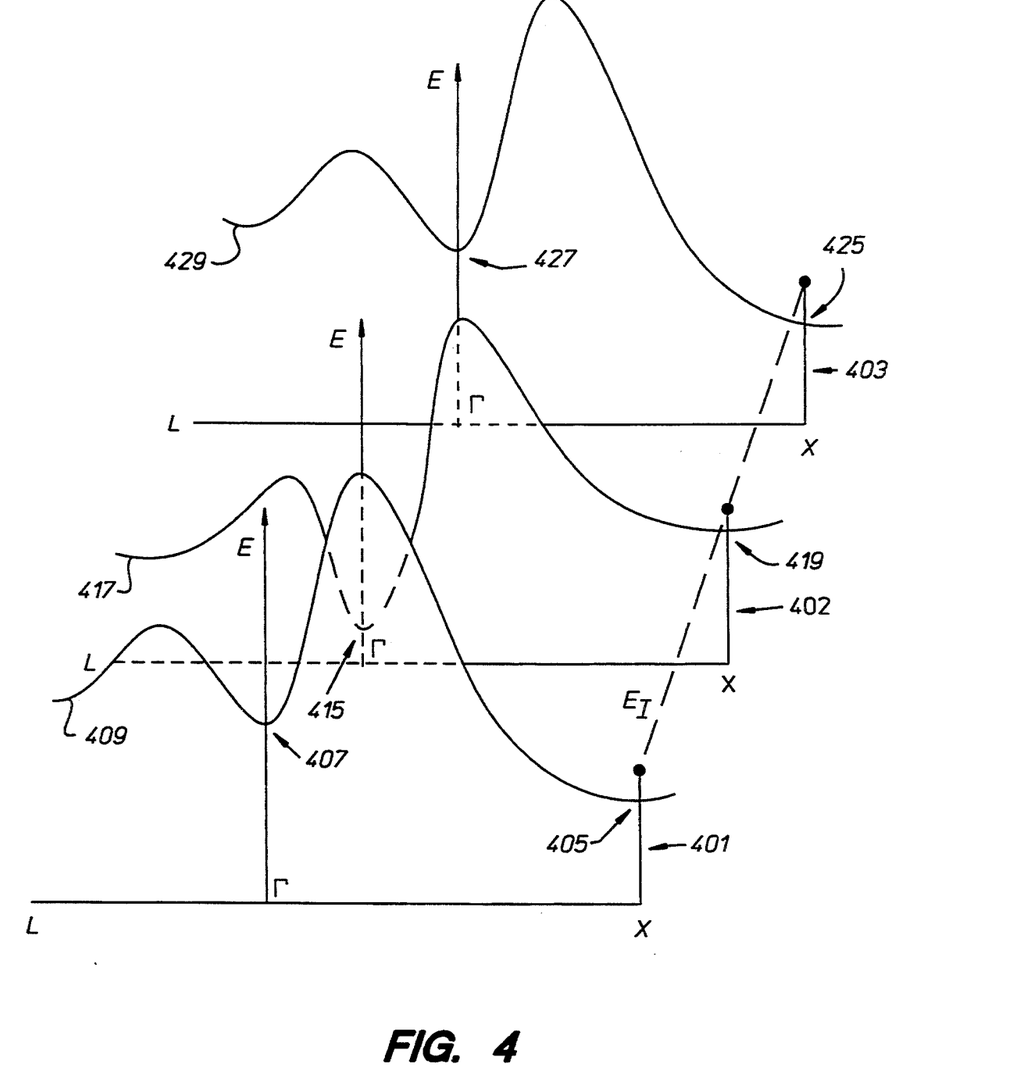
FIG. 4 shows relevant portions of the energy band structure diagrams of the emitter, base, and collector regions of the transistor of the preferred embodiment depicted in FIG. 1.

FIG. 4 shows relevant portions of the energy band structure diagrams of the emitter, base, and collector regions of the transistor of the preferred embodiment depicted in FIG. 1, wherein for illustrative purposes only, the energy band structure diagram 401 of the emitter region is drawn in foreground in FIG. 4, the energy band structure diagram 402 of the base region is drawn in mid-ground in FIG. 4, and the energy band structure diagram 403 of the collector region is drawn in background in FIG. 4. Therefore, in accordance with the preferred embodiment of the invention, in the foreground in FIG. 4 is drawn an energy band structure diagram 401 of the AlAs/GaAs superlattice, in the mid-ground in FIG. 4 is drawn an energy band structure diagram 402 of the InGaAs alloy, and in the background in FIG. 4 is drawn an energy band structure diagram 403 of the AlAs/GaAs superlattice. Vertical axes of the energy band structure diagrams correspond to energy, while horizontal axes correspond to Brillouin zone location in k-space.

In active operation of the transistor of the present invention, carriers are injected from a main sub-band 405 in the semiconducting emitter region of the transistor into a satellite sub-band 419 in the semiconducting base region of the transistor. The carriers are then transported from the satellite sub-band 419 in the base region to a main sub-band 425 in a semiconducting collector region. Intravalley scattering processes, including plasmon scattering, are not deleterious in the present invention because the carriers injected into satellite sub-band 419 of the base region are successfully collected in the main sub-band 425 of the collector region independent of any energy lost through the intravalley scattering. Of course, by definition, the intravalley scattering processes result in the carriers remaining in the satellite sub-band 419 of the base region, until they pass to the main sub-band 425 of the collector region.

In accordance with the preferred embodiment, the majority carriers of the emitter, base, and collector regions are electrons. Accordingly, the emitter region has a conduction sub-band ordering associated with the electrons. For example, as shown in foreground in FIG. 4, the AlAs/GaAs superlattice of the emitter region has a conduction band spanning k-space and including a number of conduction sub-bands arranged in a sub-band ordering. As shown, the AlAs/GaAs superlattice of the emitter region has a Brillouin zone including a conduction band main minimum 405 at a bottom of the conduction band that is located at an X point in k-space, a next lowest conduction band satellite minimum 407 that is located at a Gamma point in k-space, and a next lowest conduction band satellite minimum 409 that is located at an L point in k-space. Accordingly, the conduction sub-band ordering of the AlAs/GaAs superlattice of the emitter region is X-Gamma-L. Similarly, as illustrated in background in FIG. 4, the AlAs/GaAs superlattice of the collector region has a conduction sub-band ordering X-Gamma-L, and more specifically has a Brillouin zone including a conduction band main minimum 425 at a bottom of the conduction band that is located at an X point in k-space, a next lowest conduction band satellite minimum 427 that is located at a Gamma point in k-space, and a next lowest conduction band satellite minimum 429 that is located at an L point in k-space.

As shown in the central portion of FIG. 4, the InGaAs alloy of the base region has a conduction band including a number of conduction sub-bands arranged in a sub-band ordering that is different than that of the emitter and collector regions. As shown, the InGaAs alloy of the base region has a Brillouin zone including a conduction band main minimum 415 at a bottom of the conduction band that is located at a Gamma point in k-space, a next lowest conduction band satellite minimum 417 that is located at an L point in k-space, and a next lowest conduction band satellite minimum 419 that is located at an X point in k-space. Accordingly, the conduction sub-band ordering of the InGaAs alloy of the base region is Gamma-L-X, which is substantially different than the X-Gamma-L conduction sub-band ordering of the respective AlAs/GaAs superlattices of the emitter and collector regions.

Although there are corresponding points in k-space in the emitter and base regions, the respective sub-band orderings of the emitter and base regions are different. Accordingly, the emitter base heterojunction includes an energy barrier between sub-bands located at the corresponding points k-space in the emitter and base regions. For example, for the AlAs/GaAs superlattice and the InGaAs alloy, although there are corresponding X points in k-space in the two materials, the sub-band ordering in AlAs/GaAs superlattice is different than the sub-band ordering in InGaAs alloy. Accordingly, in this example the emitter base heterojunction includes an energy barrier between the conduction band main minimum located at the X point in the AlAs/GaAs superlattice of the emitter region and the conduction band satellite minimum located at the corresponding X point in the InGaAs alloy of the base region. As pointed out previously herein, in accordance with the principles of the invention, the base region is sufficiently doped so that under the forward bias the energy barrier is lowered to provide the flow of carriers across the emitter base heterojunction.

Furthermore, the emitter base heterojunction is sufficiently graded so that under the forward bias an injection energy level of the carriers causes the carriers to pass from a main sub-band at a point in k-space in the emitter region to the satellite sub-band at the corresponding point in k-space in the base region. For example, for the AlAs/GaAs superlattice and InGaAs, the emitter base heterojunction therebetween is sufficiently graded so that under the forward bias an injection energy level of the electron, $E_i$, shown in FIG. 4 causes the electrons to pass from the conduction band main minimum 405 at the X point in the AlAs/GaAs superlattice of the emitter region to the conduction band satellite minimum 419 at the X point in the InGaAs alloy of the base region. Under the influence of the injection energy level, $E_i$, shown in FIG. 4, the electrons are then transported from the conduction band satellite minimum 419 at the X point in the InGaAs alloy of the base region to the conduction band main minimum 425 at the X point in the AlAs/GaAs superlattice of the collector region.

Of course, the present invention is not strictly limited to materials having an X-Gamma-L conduction band ordering for the collector region of the transistor, and having a Gamma-L-X conduction sub-band ordering for the base region transistor. A guiding principle of the invention is that the collector region of the transistor has a sub-band ordering associated with the majority carriers and that the base region of the transistor has a sub-band ordering associated with the majority carriers that is different from that of the collector region. Accordingly, other embodiments of the invention have a sub-band ordering for the collector region of the transistor different than that of AlAs/GaAs superlattice or the GaAs. Similarly, it should be understood that some embodiments of the invention have sub-band ordering different than that of InGaAs alloy or the AlAs/GaAs superlattice.

Additionally, it should be understood that while it is preferred to use an AlAs/GaAs superlattice, which has a conduction band main minimum at an X point in k-space, in alternative embodiments substitution of alternative semiconductor materials that have a conduction band main minimum provides beneficial results. For example, alternative semiconductor materials such as GaP and AlP, each have a conduction band main minimum at an X point in k-space. Silicon has a conduction band main minimum substantially located at an X point in k-space.

Similarly, it should be understood that while it is preferred to use InGaAs alloy or GaAs, which have a conduction band main minimum at a Gamma point in k-space, in alternative embodiments substitution of alternative semiconductor materials that have a conduction band main minimum at Gamma provides beneficial results. For example, alternative semiconductor materials such as InAs, InP, InSb, and GaSb each have a conduction band main minimum at a Gamma point in k-space. Additionally, substitution of other alternative semiconductor materials which have a conduction band main minimum at an L point such as Germanium or PbTe for the AlAs or the GaAs provides beneficial results.

Furthermore, it should be understood that the present invention is not strictly limited to materials having electrons as majority carriers. Since another guiding principle of the invention is that the emitter, collector, and base regions have the same majority carriers, it should be understood that in some alternative embodiments, holes are the majority carriers in the emitter, collector, and base regions. Accordingly, in the collector region the sub-band ordering associated with the majority carriers is a valence sub-band ordering associated with the holes. Similarly, in the base region, the sub-band ordering associated with the majority carriers is a valence sub-band ordering that is different from the valence sub-band of the collector region.

In embodiments having holes as majority carriers, the emitter base heterojunction includes an energy barrier between valence sub-bands located at the corresponding points in k-space in the emitter and base regions. The base region is sufficiently doped so that under the suitable bias the energy barrier is lower to provide the flow of carriers across the emitter base heterojunction. The emitter base heterojunction is sufficiently graded so that under the forward bias an injection energy level of the carriers causes the carriers to pass from a valence sub-band at a point in k-space in the emitter region to the valence sub-band at the corresponding point in k-space in the base region.

For example, for another alternative embodiment wherein the collector and emitter regions are PbTe and the base region is InSb, although there are corresponding L points in k-space in the two materials, the sub-band ordering of the PbTe of the collector and emitter regions is different than the sub-band ordering of the InSb of the base region. Accordingly, in the alternative embodiment the collector base heterojunction includes an energy barrier between a valence band main maximum located an L point in the PbTe of the emitter region and the valence band satellite maximum located at the corresponding L point in the InSb of the base region. As pointed out previously herein, in accordance with the principles of the invention, the base region is sufficiently doped so that under the forward bias the energy barrier is lowered to provide the flow of carriers across the emitter base heterojunction.

Furthermore, the emitter base heterojunction is sufficiently graded so that under the forward bias an injection energy level of the carriers causes the carriers to pass from a sub-band at a point in k-space in the emitter region to the sub-band at the corresponding point in k-space in the base region. For example, for the PbTe and InSb, the emitter base heterojunction therebetween is sufficiently graded so that under the forward bias an injection energy level, $E_i$, causes the carriers to pass from the valence band main maximum at the L point in the PbTe of the emitter region to the valence band satellite maximum at the L point in the InSb of the base region.

The present invention provides a room temperature high speed transistor that does not suffer deleterious effects form plasmon scattering. Although specific embodiments of the invention have been described and illustrated, the invention is not to be limited to the specific forms or arrangements of parts so described and illustrate, and various modifications and changes can be made without departing from the scope and spirit of the invention. Within the scope of the appended claims, therefore, the invention may be practiced otherwise than as specifically described and illustrated.

What is claimed is:

1. A transistor comprising:
    a semiconducting base region having electrons as majority carriers and a conduction sub-band ordering;
    a semiconducting collector region contacting the base region at a collector-base heterojunction, the semiconducting collector region having electrons as majority carriers and having a conduction sub-band ordering different than that of the base region; and a semiconducting emitter region contacting the base region at an emitter-base heterojunction, the semiconducting emitter region having electrons as majority carriers.

2. A transistor as in claim 1 wherein the semiconducting emitter region has a conduction sub-band ordering that is different than that of the semiconducting base region.

3. A transistor as in claim 1 wherein the semiconducting base region includes a strained lattice.

4. A transistor as in claim 1 further comprising an electrical contact means coupled to the base and emitter regions for applying a forward bias to the emitter-base heterojunction so as to provide a flow of electrons across the emitter-base heterojunction.

5. A transistor as in claim 4 wherein:
the semiconducting base region has a Brillouin zone including a conduction band satellite minimum substantially located at an X point, and a conduction band main minimum located at a point other than the X point;
the semiconducting emitter region has a Brillouin zone including a conduction band main minimum substantially located at an X point;
the emitter base heterojunction includes an energy barrier between the X main minimum of the semiconducting emitter region and the X satellite minimum of the semiconducting base region; and
the semiconducting base region is doped so that under the forward bias the energy barrier is lowered to provide the flow of electrons across the emitter-base heterojunction.

6. A transistor as in claim 4 wherein:
the semiconducting base region has a Brillouin zone including a conduction band satellite minimum substantially located at a Gamma point, and a conduction band main minimum located at a point other than the Gamma point;
the semiconducting emitter region has a Brillouin zone including a conduction band main minimum substantially located at a Gamma point;
the emitter base heterojunction includes an energy barrier between the Gamma main minimum of the semiconducting emitter region and the Gamma satellite minimum of the semiconducting base region; and
the semiconducting base region is doped so that under the forward bias the energy barrier is lowered to provide the flow of electrons across the emitter-base heterojunction.

7. A transistor as in claim 4 wherein:
the semiconducting base region has a Brillouin zone including a conduction band satellite minimum substantially located at an L point, and a conduction band main minimum located at a point other than the L point;
the semiconducting emitter region has a Brillouin zone including a conduction band main minimum substantially located at an L point;
the emitter-base heterojunction includes an energy barrier between the L main minimum of the semiconducting emitter region and the L satellite minimum of the semiconducting base region; and
the semiconducting emitter region is doped so that under the forward bias the energy barrier is lowered to provide the flow of electrons across the emitter-base heterojunction.

8. A transistor comprising:

a semiconducting base region having holes as majority carriers and a valence sub-band ordering;
a semiconducting collector region contacting the base region at a collector-base heterojunction, the semiconducting collector region having holes as majority carriers and having a valence sub-band ordering different than that of the base region; and
a semiconducting emitter region contacting the base region at an emitter-base heterojunction, the semiconducting emitter region having holes as majority carriers.

9. A transistor as in claim 8 wherein the semiconducting emitter region has a valence sub-band ordering that is different than that of semiconducting base region.

10. A transistor as in claim 8 wherein the semiconducting base region includes a strained lattice.

11. A transistor as in claim 8 further comprising an electrical contact means coupled to the base and emitter regions for applying a forward bias to the emitter-base heterojunction so as to provide a flow of carriers across the emitter-base heterojunction.

12. A transistor as in claim 11 wherein:
the semiconducting base region has a Brillouin zone including a valence band satellite maximum substantially located at an L point, and a valence band main maximum located at a point other than the L point;
the semiconducting emitter region has a Brillouin zone including a valence band main maximum substantially located at an L point;
the emitter-base heterojunction includes an energy barrier between the L main maximum of the semiconducting emitter region and the L satellite maximum of the semiconducting base region; and the semiconducting emitter region is doped so that under the forward bias the energy barrier is lowered to provide the flow of holes across the emitter-base heterojunction.

13. A transistor comprising:
a semiconducting base region having a type of majority carriers and sub-band ordering associated with the majority carriers;
a semiconducting collector region contacting the base region at a collector-base heterojunction, the semiconducting collector region having the same type of majority carriers as the semiconducting base region and having a sub-band ordering different than that of the base region; and
a semiconducting emitter region contacting the base region at an emitter-base heterojunction, the semiconducting emitter region having the same type of majority carriers as the semiconducting base region.

14. A transistor as in claim 13 wherein:
the semiconducting emitter region has a sub-band ordering different than that of the base region.

15. A transistor as in claim 13 wherein:
the majority carriers of the base, collector, and emitter regions are electrons; in the semiconducting base region the sub-band ordering associated with the majority carriers is a conduction sub-band ordering associated with electrons; and in the semiconducting emitter region the sub-band ordering is a conduction sub-band ordering different from that of the base region.

16. A transistor as in claim 13 wherein:
the majority carriers of the base, collector, and emitter regions are holes;

in the semiconducting base region the sub-band ordering associated with the majority carriers is a valence sub-band ordering associated with holes; and in the semiconducting emitter region the sub-band ordering is a valence sub-band ordering the valence sub-band ordering different from that of the base region.

17. A transistor as in claim 13 further comprising an electrical contact means for applying a forward bias voltage to the emitter base heterojunction and for applying a reverse bias to the collector-base heterojunction so as to provide for active operation of the transistor.

18. A transistor as in claim 13 further comprising an electrical contact means for applying a reverse bias voltage to the emitter base heterojunction and for applying a reverse bias to the collector-base heterojunction so as to provide for cut off operation of the transistor.

19. A transistor as in claim 13 further comprising an electrical contact means for applying a forward bias voltage to the emitter base heterojunction and for applying a forward bias to the collector-base heterojunction so as to provide for saturated operation of the transistor.

20. A transistor as in claim 13 wherein the semiconducting base region includes a strained lattice.

* * * * *